United States Patent
Nakazawa et al.

(10) Patent No.: US 10,566,054 B2
(45) Date of Patent: Feb. 18, 2020

(54) SEMICONDUCTOR MEMORY DEVICE

(71) Applicant: TOSHIBA MEMORY CORPORATION, Tokyo (JP)

(72) Inventors: Shingo Nakazawa, Kamakura Kanagawa (JP); Takayuki Miyazaki, Setagaya Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 16/113,838

(22) Filed: Aug. 27, 2018

(65) Prior Publication Data

US 2019/0295639 A1 Sep. 26, 2019

(30) Foreign Application Priority Data

Mar. 23, 2018 (JP) .................................. 2018-055609

(51) Int. Cl.
*G11C 13/00* (2006.01)
*H01L 27/24* (2006.01)
*H01L 45/00* (2006.01)

(52) U.S. Cl.
CPC ........ *G11C 13/0004* (2013.01); *G11C 13/004* (2013.01); *G11C 13/0069* (2013.01); *H01L 27/2436* (2013.01); *H01L 45/06* (2013.01); *G11C 2213/79* (2013.01); *H01L 45/08* (2013.01); *H01L 45/1233* (2013.01)

(58) Field of Classification Search
None
See application file for complete search history.

(56) References Cited

U.S. PATENT DOCUMENTS

| | | | |
|---|---|---|---|
| 9,142,271 B1 | 9/2015 | Srinivasan et al. | |
| 9,401,203 B1 | 7/2016 | Chang et al. | |
| 9,741,764 B1* | 8/2017 | Terai | H01L 27/2427 |
| 2010/0163817 A1 | 7/2010 | Savransky et al. | |
| 2011/0026294 A1* | 2/2011 | Tsukamoto | B82Y 10/00 365/63 |
| 2016/0056211 A1* | 2/2016 | Cho | H01L 45/1253 711/125 |
| 2017/0117328 A1* | 4/2017 | Terai | H01L 27/2481 |
| 2019/0088324 A1* | 3/2019 | Ota | G11C 13/0007 |
| 2019/0123102 A1* | 4/2019 | Song | H01L 27/2427 |

FOREIGN PATENT DOCUMENTS

CN 104821179 A 8/2015

* cited by examiner

*Primary Examiner* — Tan T. Nguyen
(74) *Attorney, Agent, or Firm* — Kim & Stewart LLP

(57) ABSTRACT

According to one embodiment, a semiconductor memory device includes a memory cell having a variable resistance unit, a first selector, and a second selector. The first and second selectors are connected in series with the variable resistance unit and have different switching characteristics from one another. A control unit is provided to write data to the memory cell by setting a resistance state of the variable resistance unit and to read data from the memory cell according to the resistance state of the variable resistance unit.

20 Claims, 18 Drawing Sheets

SEMICONDUCTOR MEMORY DEVICE

CROSS-REFERENCE TO RELATED APPLICATIONS

This application is based upon and claims the benefit of priority from Japanese Patent Application No. 2018-055609, filed Mar. 23, 2018, the entire contents of which are incorporated herein by reference.

FIELD

Embodiments described herein relate generally to a semiconductor memory device.

BACKGROUND

In recent years, a phase change memory (PCM) has been developed as one type of a semiconductor memory device. In a PCM device, a crystallinity state (material phase) of a variable resistant element is changed by application of a voltage. By change of phase, the variable resistant element can be switched between a low resistance state (LRS) or a high resistance state (HRS). Data can be stored in a phase change memory cell by the setting of one the two states to correspond to binary data values or the like.

DETAILED DESCRIPTION

Figure 1:
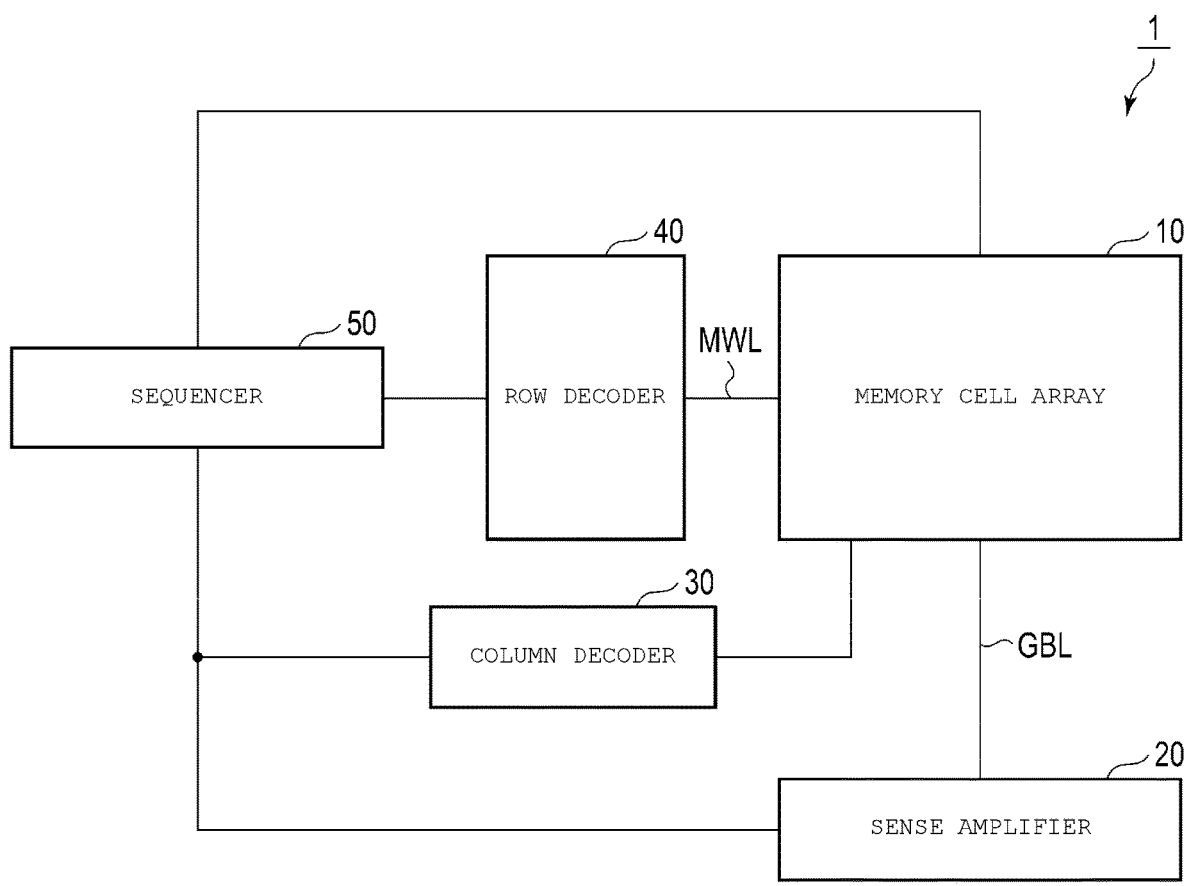
FIG. 1 is a block diagram illustrating an overall configuration of a semiconductor memory device according to a first embodiment.

In general, according to one embodiment, a semiconductor memory device includes a memory cell having a variable resistance unit, such as phase change memory unit or the like, a first selector, and a second selector. The first and second selectors are connected in series with the variable resistance unit and have different switch characteristics from one another. A control unit is provided to write data to the memory cell by setting a resistance state of the variable resistance unit and to read data from the memory cell according to the resistance state of the variable resistance unit.

Hereinafter, details of embodiments will be described with reference to the drawings. In the description, common reference numerals are given to common portions through all the drawings.

In the following example embodiments, a phase change memory (PCM) will be described as an example of a semiconductor memory device including a variable resistance element.

<1> First Embodiment

A semiconductor memory device according to a first embodiment will be described.

<1-1> Configuration

<1-1-1> Semiconductor Memory Device

FIG. 1 is a block diagram illustrating an overall configuration of a semiconductor memory device according to the first embodiment. A semiconductor memory device 1 includes a memory cell array 10, a sense amplifier 20, a column decoder 30, a row decoder 40, and a sequencer 50.

The memory cell array 10 includes a plurality of memory cells MC. Each memory cell MC is provided at an intersection of a local bit line LBL and a word line WL. Access to each memory cell MC is via a global bit line GBL connectable to a local bit line LBL and via a main word line MWL connectable to a word line WL.

The sense amplifier 20 includes a sense amplifier circuit for each global bit line GBL. The sense amplifier circuit senses data read from the memory cell MC to the global bit line GBL during a reading operation. The sense amplifier 20 also supplies a voltage to write data to the memory cell MC during a writing operation. The voltages for these reading and writing operations is supplied from the sequencer 50.

The column decoder 30 decodes a column address to obtain a column address decoding signal.

The row decoder 40 selects one or more main word line MWL based on a row address decoding signal obtained by decoding a row address.

The sequencer 50 provides overall control of the operations of the semiconductor memory device 1. The sequencer 50 reads data by stepping up or stepping down a power supply voltage VDD supplied from the outside of the semiconductor memory device 1, generates a voltage and a current as necessary for writing and erasing, and supplies the voltage and current to the memory cell array 10, the sense amplifier 20, the column decoder 30, and/or the row decoder 40.

<1-1-2> Memory Cell Array

Figure 2:
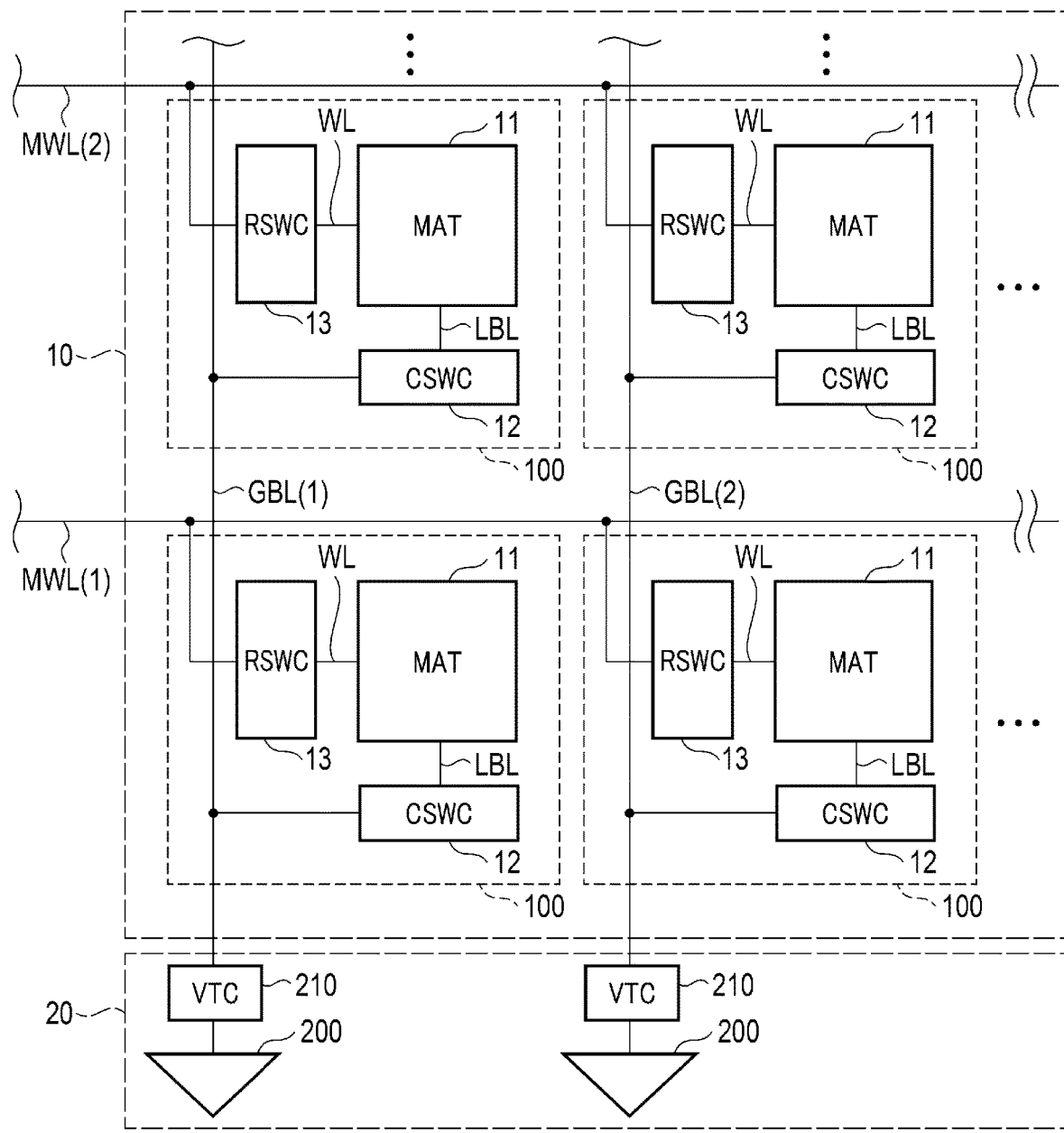
FIG. 2 is a block diagram illustrating a memory cell array of the semiconductor memory device according to a first embodiment.

FIG. 2 is a block diagram illustrating a memory cell array 10 of the semiconductor memory device according to the first embodiment.

As illustrated in FIG. 2, the memory cell array 10 includes a plurality of sub-cell arrays 100 arranged as a matrix. The sub-cell arrays 100 are connected to the sense amplifier 20 via the global bit lines GBL.

The sense amplifier 20 includes a voltage transmission circuit 210 and a sense amplifier circuit 200 for each global bit line GBL. The voltage transmission circuit 210 transmits a voltage from the global bit line GBL to the sense amplifier circuit 200 and transmits a voltage to the global bit line GBL. The sense amplifier circuit 200 senses data transmitted from the voltage transmission circuit 210.

The sub-cell array 100 includes a MAT 11, a column switch circuit 12, and a row switch circuit 13.

The MAT 11 includes a plurality of memory cells MC arranged in a matrix disposed on a semiconductor substrate. The details thereof will be described below.

The column switch circuit 12 controls the connection between the global bit line GBL and the local bit line LBL based on a signal from the column decoder 30.

The row switch circuit 13 controls the connection between the main word line MWL and the word line WL based on a signal from the row decoder 40.

<1-1-3> Column Switch Circuit and Voltage Transmission Circuit

Figure 3:
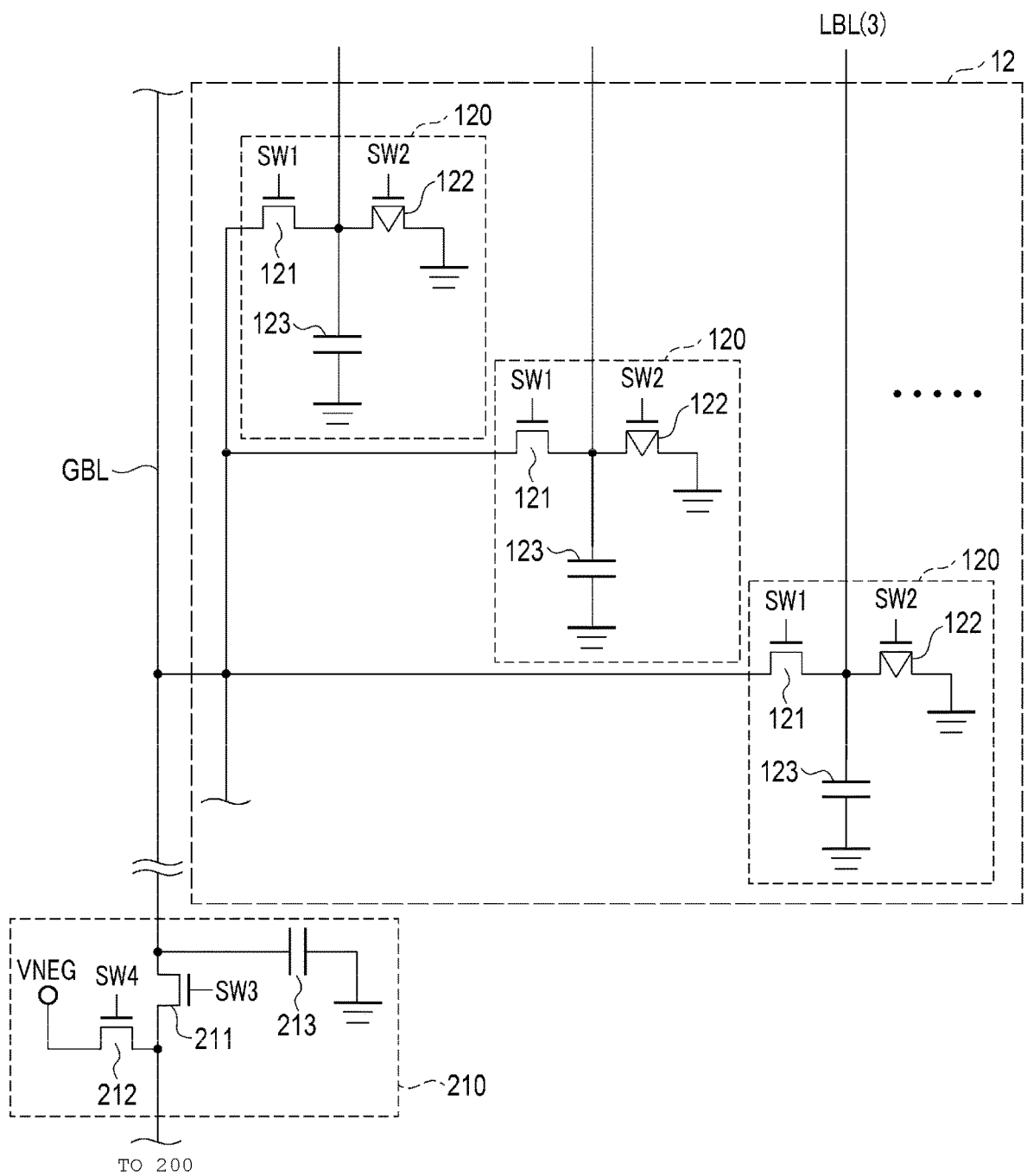
FIG. 3 is a circuit diagram illustrating a column switch circuit and a voltage switch circuit of the semiconductor memory device according to the first embodiment.

FIG. 3 is a circuit diagram illustrating a column switch circuit and a voltage transmission circuit of the semiconductor memory device according to the first embodiment.

As illustrated in FIG. 3, the column switch circuit 12 includes a column control circuit 120 for each local bit line LBL (three local bit lines LBL are explicitly depicted in FIG. 3).

Each column control circuit 120 includes an NMOS transistor 121 that controls the connection between a global bit line GBL and a local bit line LBL, a PMOS transistor 122 that transmits a reference voltage VSS to the local bit line LBL, and a capacitor 123 that stores a charge of the local bit line LBL.

The transistor 121 enters an ON state (conductive state) based on a signal SW1 at an "H" level and thus connects the global bit line GBL to the local bit line LBL.

The transistor 122 enters an ON state based on a signal SW2 at an "L" level and transmits the reference voltage VSS to the local bit line LBL when ON.

One end of the capacitor 123 is connected to the local bit line LBL and the reference voltage VSS is supplied to the other end of the capacitor 123. Electrostatic capacitance of the capacitor 123 is C1.

As illustrated in FIG. 3, the voltage transmission circuit 210 includes an NMOS transistor 211 that controls connection between the global bit line GBL and the sense amplifier circuit 200, an NMOS transistor 212 that transmits a negative voltage VNEG to the global bit line GBL, and a capacitor 213 that stores a charge of the global bit line GBL.

The transistor 211 enters an ON state based on a signal SW3 with the "H" level and connects the global bit line GBL and the sense amplifier circuit 200 to each other.

The transistor 212 enters an ON state based on a signal SW4 with the "H" level and thereby transmits the voltage VNEG to the global bit line GBL.

One end of the capacitor 213 is connected to the global bit line GBL and the reference voltage VSS is supplied to the other end of the capacitor 213. Electrostatic capacitance of the capacitor 213 is C2. The capacitor 213 is, for example, the global bit line GBL.

<1-1-4> Row Switch Circuit

Figure 4:
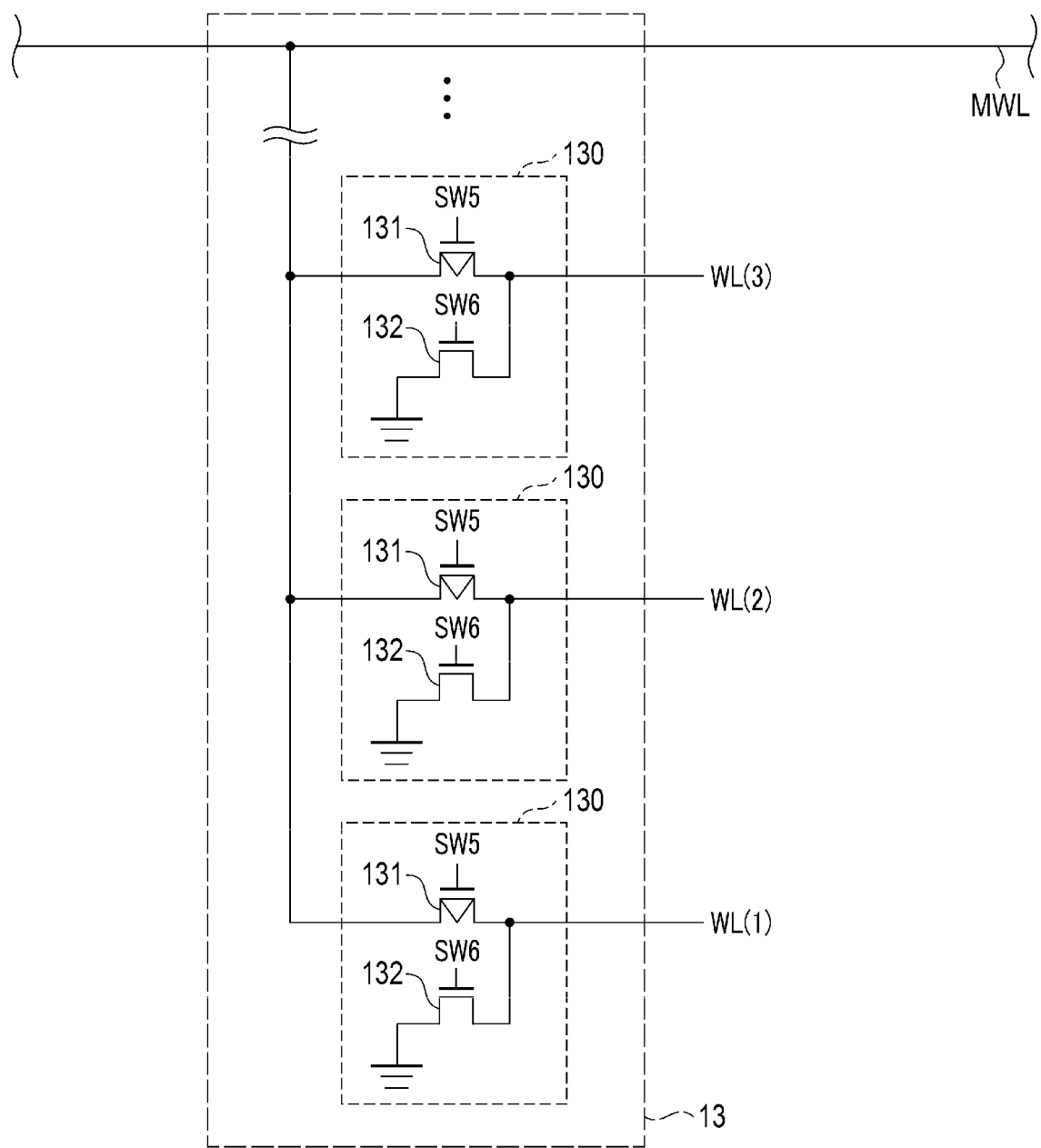
FIG. 4 is a circuit diagram illustrating a row switch circuit of the semiconductor memory device according to the first embodiment.

FIG. 4 is a circuit diagram illustrating the row switch circuit of the semiconductor memory device according to the first embodiment.

As illustrated in FIG. 4, the row switch circuit 13 includes a row control circuit 130 for each word line WL (three word lines are explicitly depicted).

The row control circuit 130 includes a PMOS transistor 131 that controls the connection between the main word line MWL and the word line WL and an NMOS transistor 132 that transmits the reference voltage VSS to the word line WL when ON.

The transistor 131 enters an ON state based on a signal SW5 at the "L" level and connects the main word line MWL to (local) the word line WL.

The transistor 132 enters an ON state based on a signal SW6 at the "H" level and thus transmits the reference voltage VSS to the word line WL.

<1-1-5> MAT (Matrix)

Figure 5:
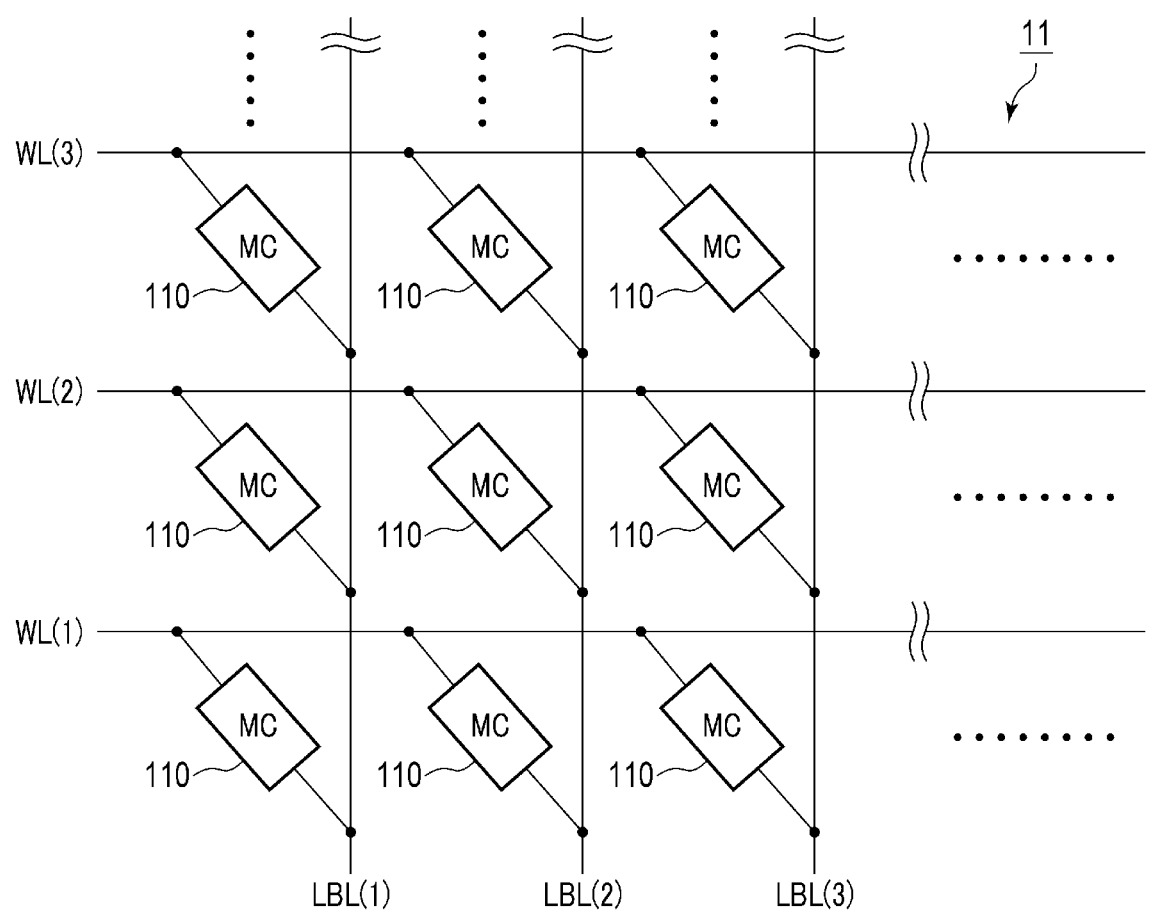
FIG. 5 is a circuit diagram illustrating a matrix group in the semiconductor memory device according to a first embodiment.

FIG. 5 is a circuit diagram illustrating a MAT (matrix) structure in the semiconductor memory device according to the first embodiment.

As illustrated in FIG. 5, a MAT 11 comprises a plurality of memory cells MC arranged in a matrix form on the semiconductor substrate. Any number of memory cells MC can be included in the MAT 11. The memory cells MC in the same column of MAT 11 are connected in common to one local bit line LBLk (where k is an integer equal to or greater than 0). The memory cells MC arranged in the same row are connected in common to one word line WLm (where m is an integer equal to or greater than 0).

<1-1-6> Memory Cell

Figure 6:
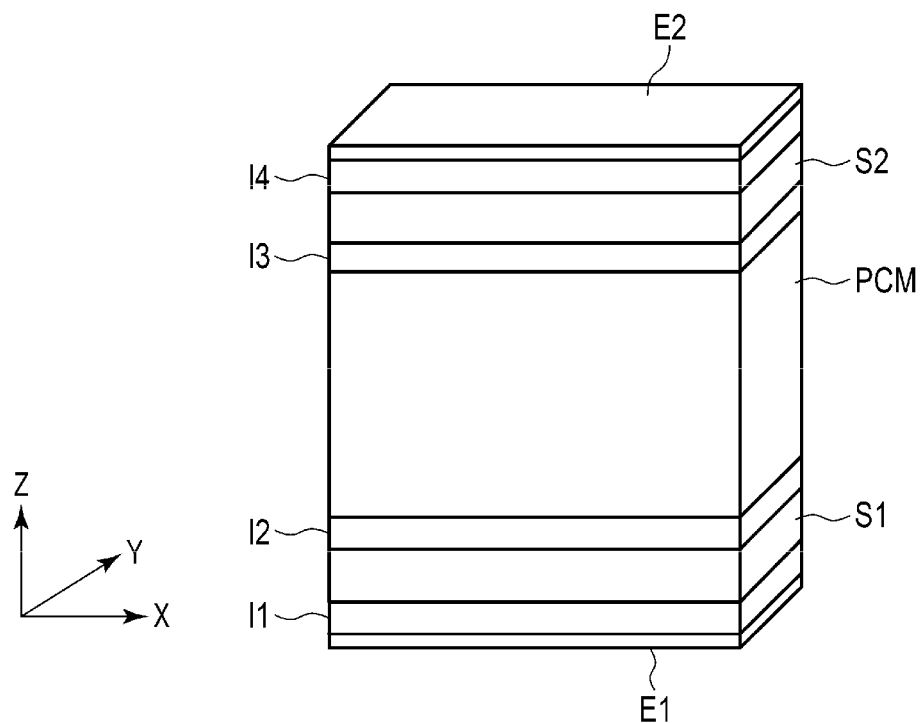
FIG. 6 is a perspective view illustrating a structure of a memory cell.

Next, a memory cell of the semiconductor memory device according to the first embodiment will be described with reference to FIG. 6. FIG. 6 is a perspective view illustrating a memory cell MC.

As illustrated in FIG. 6, a memory cell MC includes a lower electrode E1, an intermediate layer I1 provided on the lower electrode E1, a selector S1 provided on the intermediate layer I1, an intermediate layer I2 provided on the selector S1, a PCM (also referred to as a resistance change unit or a variable resistance unit) provided on the intermediate layer I2, an intermediate layer I3 provided on the PCM, a selector S2 provided on the intermediate layer I3, an intermediate layer I4 provided on the selector S2, and an upper electrode E2 provided on the intermediate layer I4. As illustrated in FIG. 6, the two selectors S1 and S2 are provided such that the PCM is interposed between. In this embodiment, the PCM enters a low resistance or high resistance state by application of heat and control of cooling rate/time after the heating of the material of the PCM by Joule heating. The resistance state varies in accordance with the crystallinity (phase type) of the PCM material. The crystallinity of the PCM material can be controlled/set in accordance with the cooling rate of the PCM after a heating process. Hereinafter, a change in crystallinity (crystalline state) of the PCM is referred to as a "phase change", the low resistance state (LRS) of the PCM is referred to as the "set state", and the high resistance state (HRS) of the PCM is referred to as the "reset state".

In this embodiment, the selectors S1 and S2 are each, for example, a switch element between two terminals. When a voltage to be applied across the two terminals is equal to or less than a threshold, the switch element is in an "OFF" state and is, for example, an electrically high resistance state. When a voltage to be applied across the two terminals is equal to or greater than the threshold, the switch element is in an "ON" state and is, for example, an electrically low resistance state. The switch element may have this function regardless of voltage polarity. The switch element comprises, for example, at least one chalcogen element selected from a group consisting of tellurium (Te), selenium (Se), and sulfur (S). Alternatively, the switch element may comprise a chalcogenide, which is a compound containing a chalcogen element. Additionally, the switch element may comprise at least one element selected from a group consisting of B, Al, Ga, In, C, Si, Ge, Sn, As, P, and Sb. The switch element may be arsenic (As) doped $SiO_2$, volatile conductive-bridging random access memory (CBRAM), or the like in addition to or instead of a chalcogenide-based material.

In the first embodiment, as will be described below, the memory cell includes two selectors to limit a current flowing in the memory cell. Characteristics of the two selectors (S1 and S2) are preferably different. For example, two selectors have different threshold voltages Vth (voltage characteristics). In this context, the threshold voltage is a voltage at which a current flowing through a selector sharply increases. The two selectors (S1 and S2) can have different threshold currents Ith (current characteristics). Furthermore, the two selectors (S1 and S2) have different current-voltage (IV) characteristics. To change any of the characteristics of the selectors, the planar (XY plane) area of a selector maybe changed, a material composition of a selector may be changed, or a height of a selector in the Z direction (also referred to as a layer thickness of the selector) may be changed.

The material of an intermediate layer (I1, I2, I3, I4) may be, for example, a metal. One or more of the intermediate layers may also be omitted in some embodiments.

<1-1-7> Characteristics of Memory Cell

Figure 7:
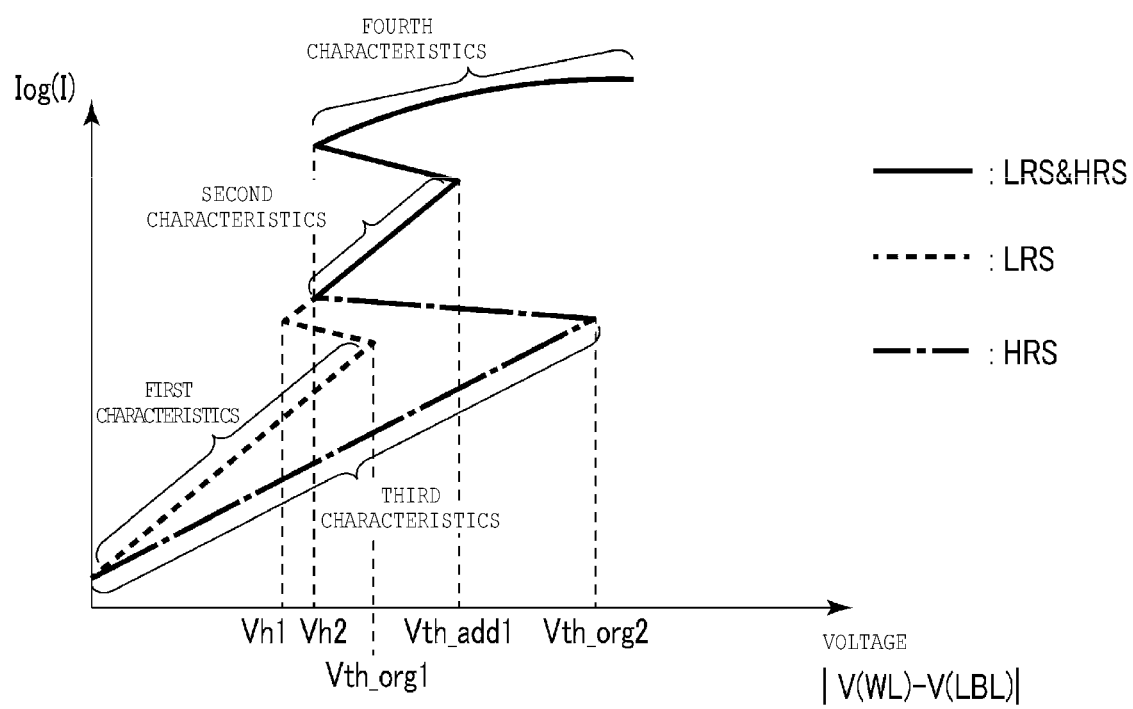
FIG. 7 is a graph illustrating aspects of the current-voltage (IV) characteristics of a memory cell.
Figure 8:
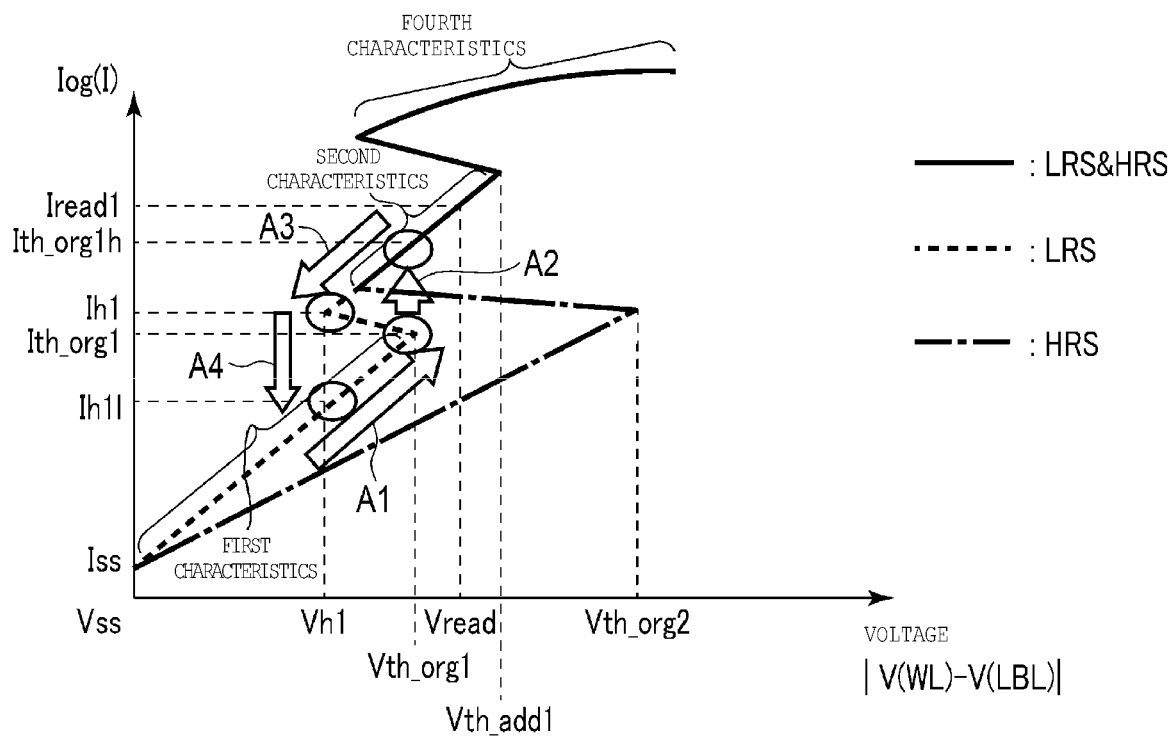
FIG. 8 is a graph illustrating aspects of the current-voltage (IV) characteristics of a memory cell.
Figure 9:
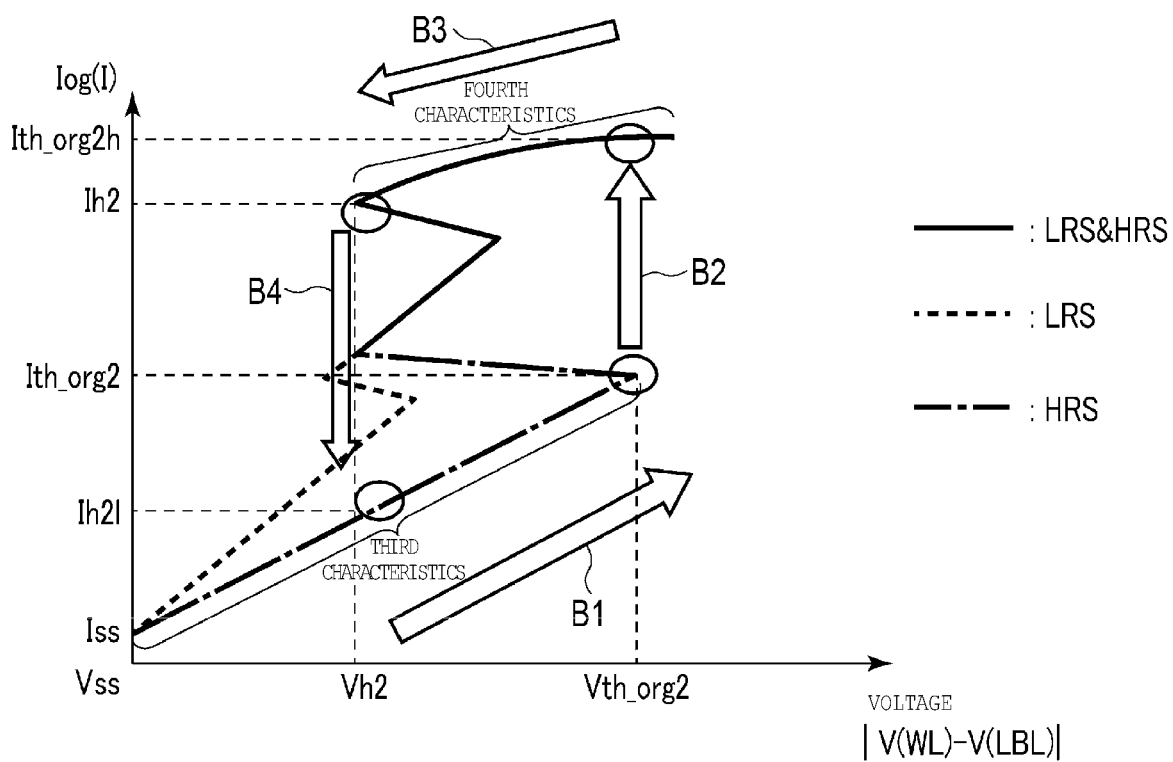
FIG. 9 is a graph illustrating aspects of the current-voltage (IV) characteristics of a memory cell.

Next, current-voltage (IV) characteristics of the memory cell of the semiconductor memory device according to the first embodiment will be described with reference to FIGS. 7 to 9. FIGS. 7 to 9 are graphs illustrating IV characteristics of the memory cell. The horizontal axis represents a voltage) applied to the memory cell MC and the vertical axis represents a cell current flowing in the memory cell MC. The vertical axis is at a log scale. The voltage applied to the memory cell MC corresponds to the difference between the voltage of the word line (V(WL)) and the voltage of the local bit line (V(BL)).

As illustrated in FIG. 7, the memory cell MC has different IV characteristics in the low resistance state LRS and the high resistance state HRS.

When the memory cell MC is in the low resistance state LRS, the characteristics of the memory cell MC match the portion of the dotted line labeled "first characteristics" in the drawing until the voltage applied to the memory cell MC reaches a voltage Vth_org1. Therefore, the cell current varies according to the first characteristics. The characteristics of the memory cell MC transition from the "first characteristics" to "second characteristics" in the drawing when the voltage applied to the memory cell MC exceeds the voltage Vth_org1. Therefore, when the voltage applied to the memory cell MC exceeds the voltage Vth_org1, the cell current varies according to the second characteristics. The characteristics of the memory cell MC are the second characteristics until the voltage applied to the memory cell MC reaches a voltage Vth_add1. The characteristics of the memory cell MC transition from the second characteristics to the first characteristics when the voltage applied to the memory cell MC is equal to or less than a voltage Vh1 and there has been no change the original (LRS) resistance state of the memory cell MC. Therefore, in this scenario when the voltage applied to the memory cell MC is equal to or less than the voltage Vh1, the cell current varies again according to the first characteristics.

When the memory cell MC is in the high resistance state HRS, the characteristics of the memory cell MC are "third characteristics" in the drawing until the voltage applied to the memory cell MC reaches a voltage Vth_org2. The characteristics of the memory cell MC transition from the third characteristics to "fourth characteristics" in the drawing when the voltage applied to the memory cell MC exceeds the voltage Vth_org2. Therefore, after the voltage applied to the memory cell MC exceeds the voltage Vth_org2, the cell current varies according to the fourth characteristics. When the characteristics of the memory cell MC are the fourth characteristics, the characteristics of the memory cell MC transition from the fourth characteristics to the second characteristics when the voltage applied to the memory cell MC is equal to or less than a voltage Vh2 without changing the original resistance state of the memory cell MC. Therefore, when the voltage applied to the memory cell MC is equal to or less than the voltage Vh2, the cell current varies according to the third characteristics.

The cell current when the memory cell MC is in the low resistance state LRS will be described with reference to FIG. 8.

As illustrated in FIG. 8, when the voltage applied to the memory cell MC is stepped up from the reference voltage VSS to the voltage Vth_org1 (where VSS<Vth_org1), the cell current increases from a current ISS to a current Ith_org1 (where ISS<Ith_org1) according to the first characteristics region (see arrow A1). Then, once the voltage applied to the memory cell MC exceeds the voltage Vth_org1, the cell current sharply increases from the current Ith_org1 to a current Ith_org1h (where Ith_org1<<Ith_org1h) (see arrow A2). The voltage Vth_org1 at which the cell current flowing in the memory cell MC in the low resistance state LRS sharply increases is referred to as a first threshold voltage. When the voltage applied to the memory cell MC is stepped down from the voltage Vth_org1 to the voltage Vh1 (where Vh1<Vth_org1), the cell current decreases from the current Ith_org1h to the current Ih1 (where Ih1<Ith_org1h) according to the second characteristics region (see arrow A3). Then, when the voltage applied to the memory cell MC is stepped down to the voltage Vh1 or less, the cell current sharply decreases from a current Ih1 to a current Ih11 (where Ih11<<Ih1) (see arrow A4). The voltage Vh1 at which the current flowing in the memory cell MC in the low resistance state LRS sharply decreases is referred to as a second threshold voltage.

Next, the cell current when the memory cell MC is in the high resistance state HRS will be described with reference to FIG. 9.

As illustrated in FIG. 9, when the voltage applied to the memory cell MC is stepped up from the reference voltage VSS to the voltage Vth_org2 (where VSS<Vth_org2), the cell current increases from the current ISS to a current Ith_org2 (where ISS<Ith_org2) according to the third characteristics region (see arrow B1). Then, when the voltage applied to the memory cell MC exceeds the voltage Vth_org2, the cell current sharply increases from the current Ith_org2 to a current Ith_org2h (where Ith_org2<<Ith_org2h) (see arrow B2). The voltage Vth_org2 at which the cell current flowing in the memory cell MC in the high resistance state HRS sharply increases is referred to as a third threshold voltage. When the voltage applied to the memory cell MC is stepped down from the voltage Vth_org2 to the voltage Vh2 (where Vh2<Vth_org2), the cell current decreases from the current Ith_org2h to a current Ih2 (where Ih2<Ith_org2) according to the second characteristics (see an arrow B3). Then, when the voltage applied to the memory cell MC is stepped down the voltage Vh2 or less, the cell current sharply decreases from the current Ih2 to a current Ih21 (where Ih21<<Ih2) (see arrow B4). The voltage Vh2 at which the current flowing in the memory cell MC in the high resistance state HRS sharply decreases is referred to as a fourth threshold voltage.

Figure 10:
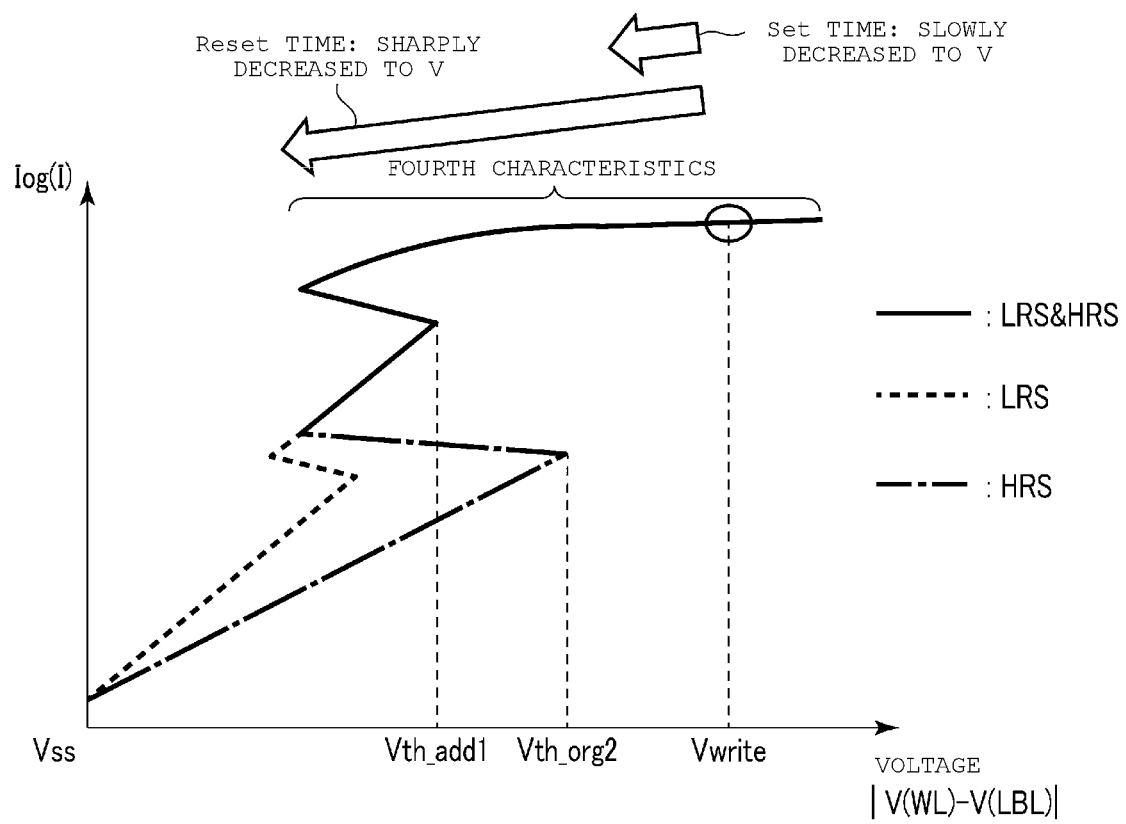
FIG. 10 is a graph illustrating aspects of the current-voltage (IV) characteristics of a memory cell.

A method of changing a resistance state of the memory cell MC will be described with reference to FIG. 10.

The temperature of the memory cell MC becomes high and the PCM is melted (placed in a molten state) when a high voltage Vwrite applied. Then, the molten PCM is sharply cooled to enter an amorphous state. As a result, the PCM enters the high resistance state (HRS) also referred to as the reset state. To provide fast cooling of the PCM, the voltage Vwrite applied to the memory cell may be controlled to sharply fall to the voltage VSS. When the molten PCM is more slowly cooled it can enter a crystalline state. As a result, the PCM enters the low resistance state (LRS) also referred to as the set state. To provide slower cooling of the PCM, the voltage Vwrite applied to the memory cell may be controlled to slowly fall to the voltage VSS.

Figure 11:
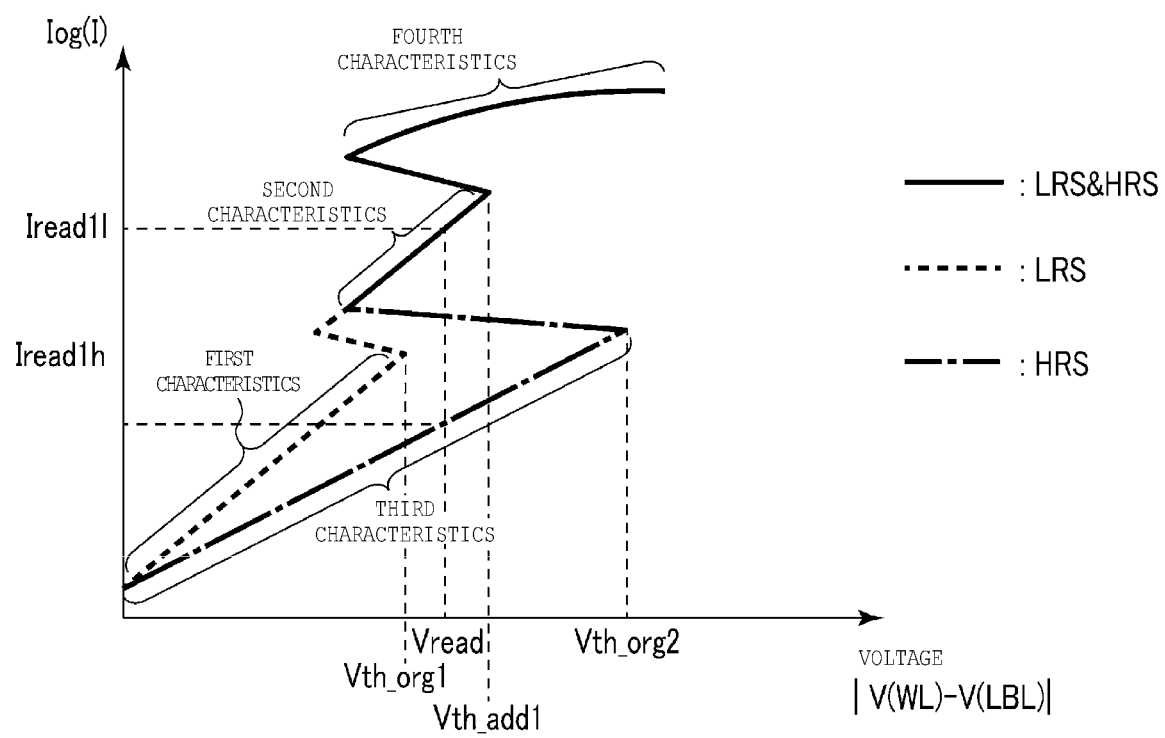
FIG. 11 is a graph illustrating aspects of the current-voltage (IV) characteristics of a memory cell.

A voltage VREAD for determining a resistance state of the memory cell MC will be described with reference to FIG. 11.

The threshold voltage at which the current flowing in the memory cell MC sharply increases is different in accordance with the resistance state set in the memory cell MC. Accordingly, as illustrated in FIG. 11, the read voltage VREAD is set between the first threshold voltage (voltage Vth_org1) and the third threshold voltage (voltage Vth_org2). Thus, the semiconductor memory device 1 can determine the resistance state of the memory cell MC based on magnitude of the current flowing in the memory cell MC. Thus, the semiconductor memory device 1 determines previously stored data based on the reading result.

By providing two selectors in the memory cell, as described above, it is possible to obtain the foregoing IV characteristics. For example, the first selector S1 is a selector that has characteristics in which the threshold voltage Vth_add1>the voltage Vread is obtained. The second selector S2 is a selector that has characteristics in which the threshold voltage Vth_org1<the threshold voltage Vth_org2 is obtained.

As a result, in the IV characteristics of the memory cell of the semiconductor memory device according to the first embodiment, it is possible to obtain a voltage relation in which the threshold voltage Vth_org1<the read voltage Vread<the threshold voltage Vth_add1<the threshold voltage Vth_org2.

<1-2> Operation

Hereinafter, an operation of the semiconductor memory device according to the first embodiment will be described.

<1-2-1> Selected Memory Cell

The memory cells which are targets on which a read operation or a write operation is performed are referred to as selected memory cells and the other cells are referred to as unselected memory cells or, in some cases, half-selected memory cells.

Figure 12:
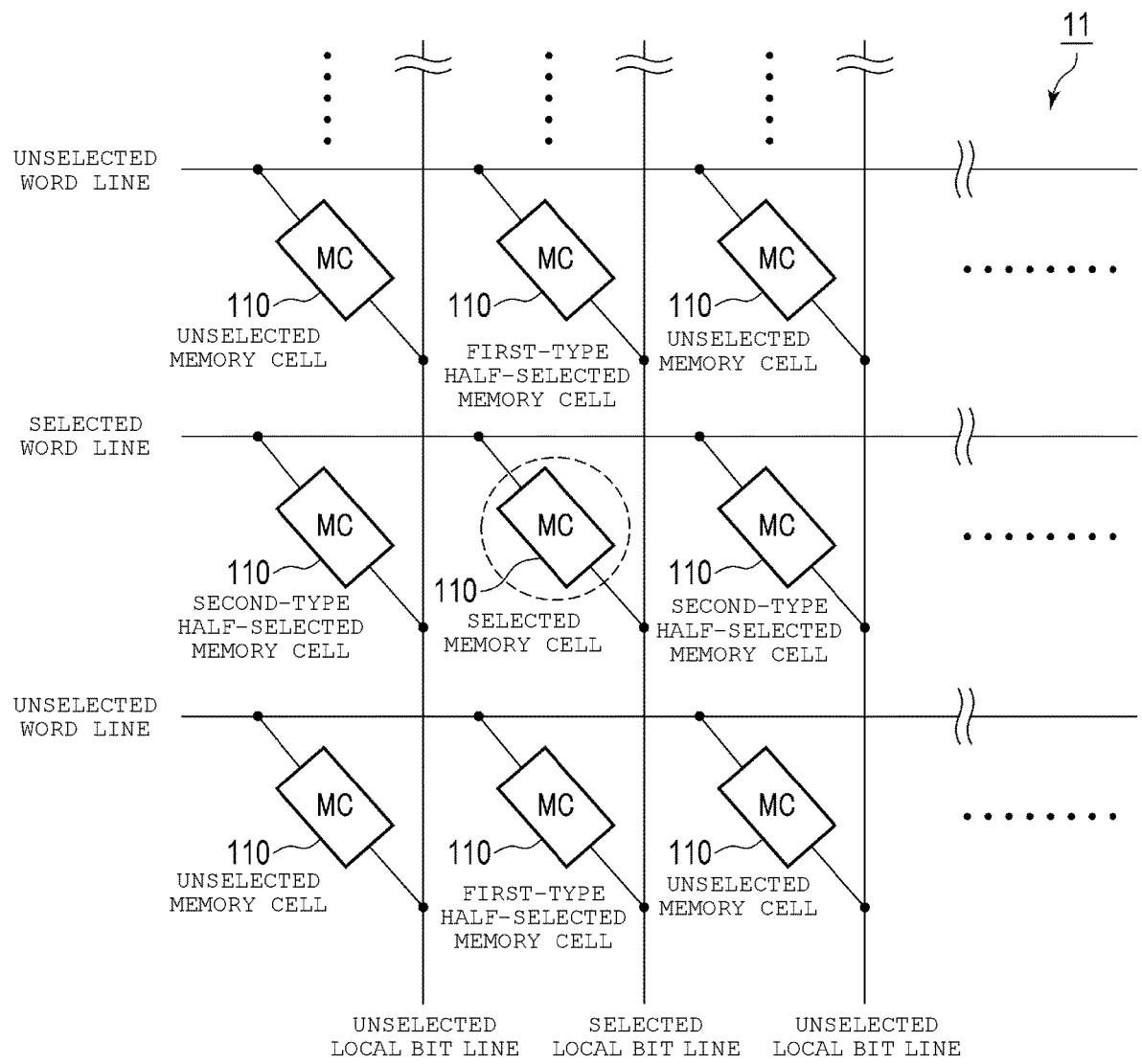
FIG. 12 is a circuit diagram illustrating a selected memory cell MC, an unselected memory cell MC, and a half-selected memory cell MC.

Definition of the selected memory cell MC, the unselected memory cell MC, and the half-selected memory cell MC will be described with reference to FIG. 12. FIG. 12 is a circuit diagram illustrating the selected memory cell MC, the unselected memory cell MC, and the half-selected memory cell MC.

As illustrated in FIG. 12, the selected memory cell MC is the memory cell MC which is a read/write operation target. The local bit line LBL connected to the selected memory cell MC is referred to as a selected local bit line LBL. The word line WL connected to the selected memory cell MC is referred to as a selected word line WL.

As illustrated in FIG. 12, an unselected memory cell MC is a memory cell MC which is connected to neither the selected local bit line LBL nor the selected word line WL. A local bit line LBL connected to an unselected memory cell MC is referred to as an unselected local bit line LBL. A word line WL connected to an unselected memory cell MC is referred to as an unselected word line WL.

As illustrated in FIG. 12, a half-selected memory cell MC is not a read/write operation target but is connected to one of a selected local bit line LBL or a selected word line WL. The memory cell MC connected to a selected local bit line LBL and an unselected word line WL is referred to as a first-type half-selected memory cell MC. The memory cell MC connected to an unselected local bit line LBL and a selected word line WL is referred to as a second-type half-selected memory cell MC.

<1-2-1> Write Operation

Figure 13:
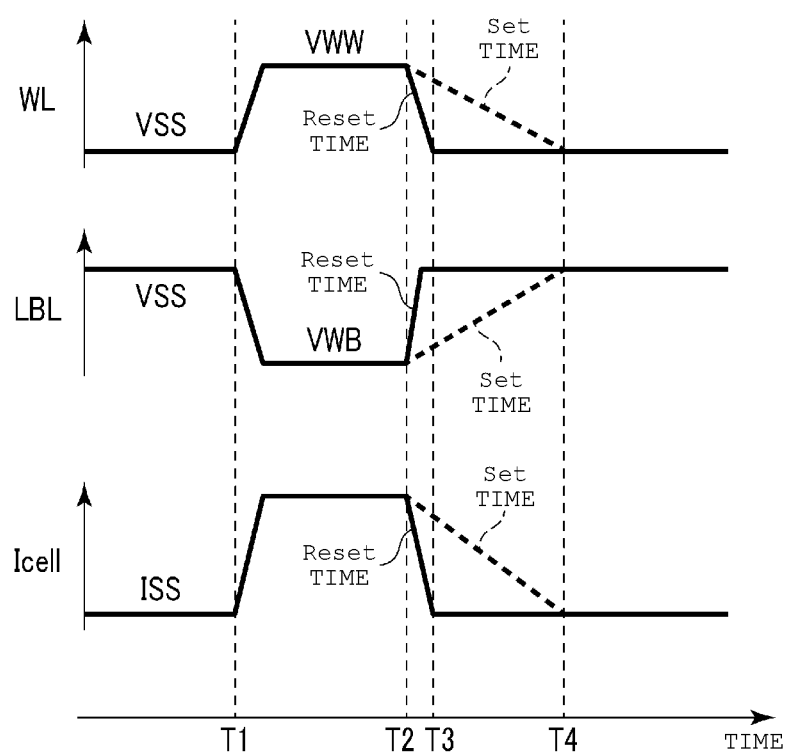
FIG. 13 is a timing chart illustrating aspects of a write operation.

A write operation related in the selected memory cell MC will be described with reference to FIG. 13. FIG. 13 is a timing chart illustrating a write operation of the semiconductor memory device according to the first embodiment. FIG. 13 illustrates the word line WL, the local bit line LBL, and a cell current Icell. Time T1 and Time T2

The sequencer 50 transmits a first write voltage (negative voltage) VWB (where VWB<VSS) to the local bit line LBL associated with the selected memory cell MC.

The sequencer 50 transmits a second write voltage (positive voltage) VWW (where VSS<VWW) to the word line associated with the selected memory cell MC.

The first write voltage VWB and the second write voltage VWW are voltages at which a voltage to be applied to the selected memory cell MC is the voltage Vwrite. Vwrite is the absolute value of a difference between the voltage V (WL) of the selected word line and the voltage V (LBL) of the selected local bit line.

Time T2 to Time T4

When the selected memory cell MC enters the reset state, the sequencer 50 sharply increases (steps up) the voltage of the selected local bit line (time T2 and time T3) and sharply decreases the voltage of the selected word line. Thus, it is possible to sharply cool the selected memory cell MC. In this case, the cell current Icell sharply falls.

When the selected memory cell MC enters the set state, the sequencer 50 gradually increases (steps up) the voltage of the selected local bit line (time T2 to time T4) and slowly decreases the voltage of the selected word line. Thus, the selected memory cell MC can be slowly cooled. In this case, the cell current Icell gradually falls.

As described above, the write operation on the selected memory cell MC can be performed.

<1-2-2> Read Operation

Figure 14:
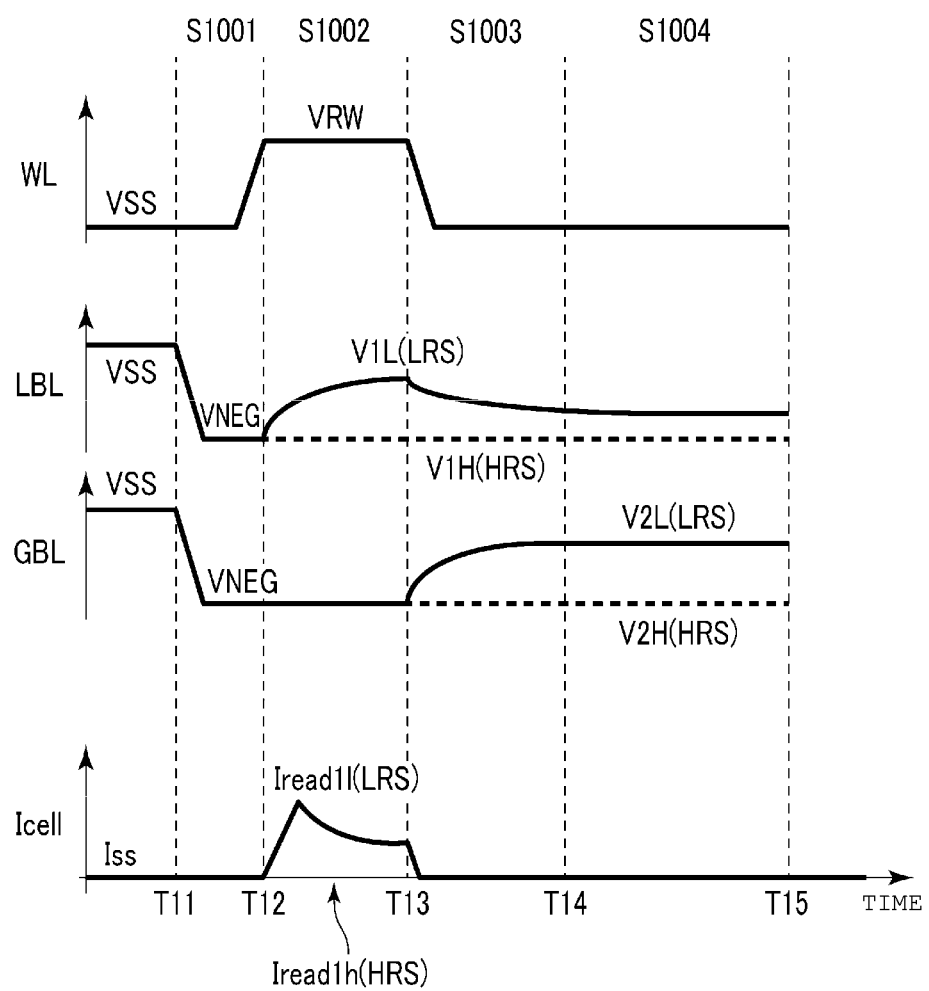
FIG. 14 is a timing chart illustrating aspects of a read operation.

A read operation related to the selected memory cell MC will be described with reference to FIG. 14. FIG. 14 is a timing chart illustrating a read operation of the semiconductor memory device according to the first embodiment. FIG. 14 illustrates the word line WL, the local bit line LBL, the global bit line GBL, and the cell current Icell.

Time T11 and Time T12

The sequencer 50 transmits the voltage (negative voltage) VNEG (where VNEG<VSS) to the selected global bit line GBL and the selected local bit line LBL.

Time T12 and Time T13

The sequencer 50 transmits a read voltage (positive voltage) VRW to the selected word line. The sequencer 50 stops precharging of the selected local bit line LBL and applies the read voltage to the memory cell MC.

The voltage VNEG and the voltage VRW are voltages at which a voltage applied to the selected memory cell MC is the voltage VREAD.

When the selected memory cell MC is in the low resistance state, the voltage V(WL) of the selected word line is stepped up, and a difference between the voltage V (WL) of the selected word line and the voltage V (LBL) of the selected local bit line is set to be equal to or greater than the voltage Vth_org1, the cell current Icell flowing in the selected memory cell MC in the low resistance state sharply increases.

Then, in the selected memory cell MC, a large cell current flows from the selected word line to the selected local bit line, so that the voltage V (LBL) of the selected local bit line is stepped up (or charged) at a voltage V1L. Thus, the voltage applied across the selected memory cell MC decreases. As described above, when the voltage applied to the selected memory cell MC is equal to or less than the voltage Vh1, the characteristics of the memory cell MC transition from the second characteristics region to the first characteristics region.

When the selected memory cell MC is in the high resistance state, even though the difference between the voltage V(WL) of the selected word line and the voltage V (LBL) of the selected local bit line reaches the voltage Vread, the characteristics do not transition from the third characteristics to the fourth characteristics. Therefore, a variation in the cell current Icell is less than when the selected memory cell MC is in the low resistance state.

Based on the voltage of the selected local bit line LBL which is a read result, a charge is stored in the capacitor 123 of the column control circuit 120.

Time T13 and Time T14

The sequencer 50 shares the charge stored in the capacitor 123 of the column control circuit 120 with the capacitor 213 of the voltage transmission circuit 210. When the selected memory cell is in the low resistance state, the voltage of the selected global bit line GBL is stepped up from the voltage V1L to a voltage V2L. When the selected memory cell is in the high resistance state, the voltage of the selected global bit line GBL is stepped up from a voltage V1H to a voltage V2H.

The sequencer 50 sets the selected word line WL to the reference voltage VSS.

Time T14 to Subsequent Times

The sequencer 50 transmits the charge retained in the capacitor 213 to the sense amplifier circuit 200. Thus, the sense amplifier circuit 200 can determine a resistance state of the selected memory cell MC based on the charge.

<1-3> Advantages

According to the above-described embodiment, the semiconductor memory device includes two selectors having different characteristics. Thus, it is possible to better prevent erroneous writing of the memory cells than when the memory cell includes only one selector.

Hereinafter, a comparison example will be described. In particular, a semiconductor memory device according to the comparative example will be described with reference to FIGS. 15 and 16.

Figure 15:
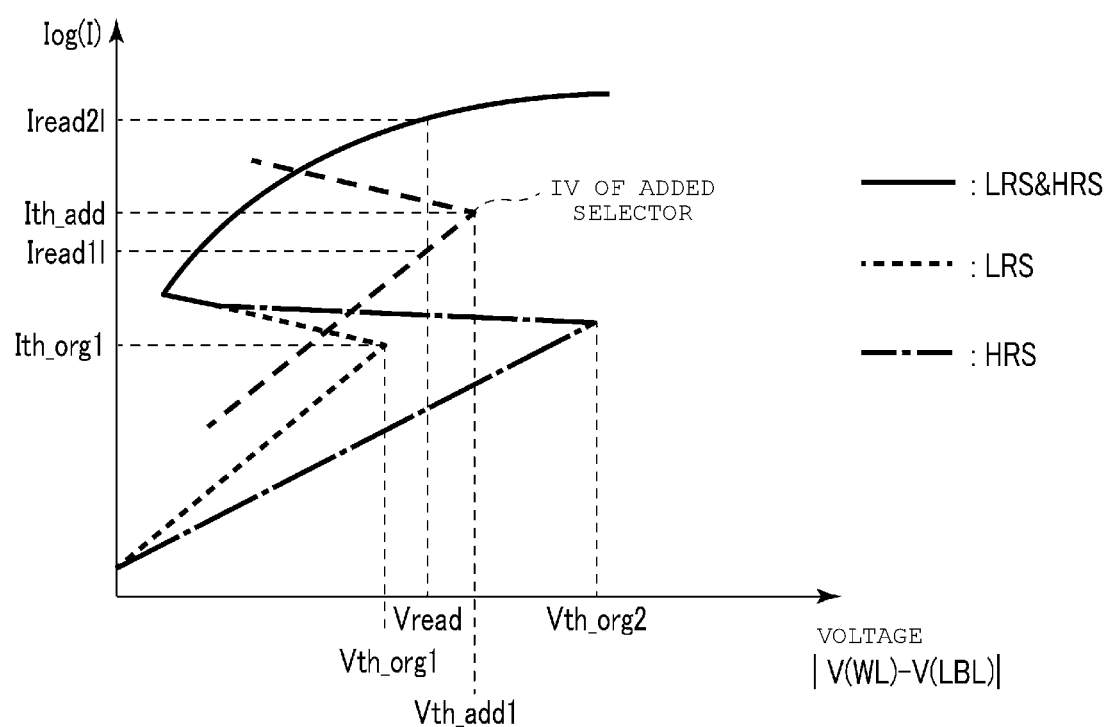
FIG. 15 is a graph illustrating current-voltage (IV) characteristics of a memory cell.
Figure 16:
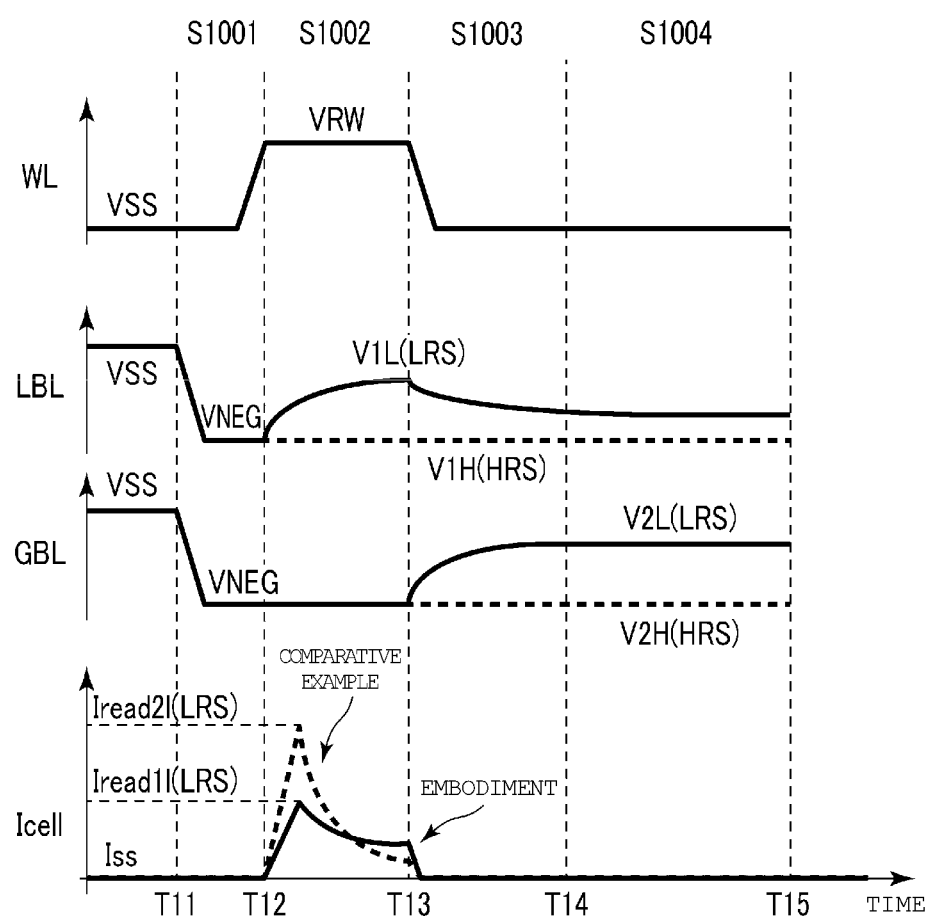
FIG. 16 is a timing chart illustrating aspects of a read operation.

FIG. 15 is a graph illustrating IV characteristics of the memory cells of the semiconductor memory device according to the comparative example. FIG. 16 is a timing chart illustrating a read operation of the semiconductor memory device according to the comparative example.

The memory cell of the semiconductor memory device according to the comparative example includes only one selector. In such a case, IV characteristics of the memory cell will be the characteristics illustrated in FIG. 15.

As illustrated in FIG. 15, when the memory cell is in a low resistance state and the voltage Vread is applied to the memory cell, the current value is Iread21.

The label "IV of an added selector" in FIG. 15, represents the characteristics of a memory cell in which another a selector is provided (see e.g., FIG. 6). With such a change to the comparative example, a current Iread11 lower than the current Iread21 could be set even when the voltage Vread is applied to the memory cell in the low resistance state.

As described above, when a large voltage is applied to the memory cell and a large current flows, the temperature of the memory cell becomes high and the PCM is melted. As a result, a resistance state may be changed.

As illustrated in FIG. 16, in the comparison example, a large current flows to the memory cell at the time of a read operation. As a result, there is a possibility of an unintentional write operation being performed of the memory cell.

However, in the first embodiment in contrast with the comparative example, even when the voltage Vread is applied to the memory cell in the low resistance state, a selector is provided so that a large current cannot flow. As a result, it is possible to prevent erroneous writing at the time of a read operation.

<2> Second Embodiment

A second embodiment will be described. In the second embodiment, a case in which another method of stacking selectors in a memory cell will be described. The basic configuration and the basic operation of a device according to the second embodiment are the same as those of the device according to the first embodiment. Accordingly, the aspects described in the above-described first embodiment and aspects which can be easily inferred from the above-described first embodiment will not be described for the second embodiment.

<2-1> Configuration

<2-1-1> Memory Cell

Figure 17:
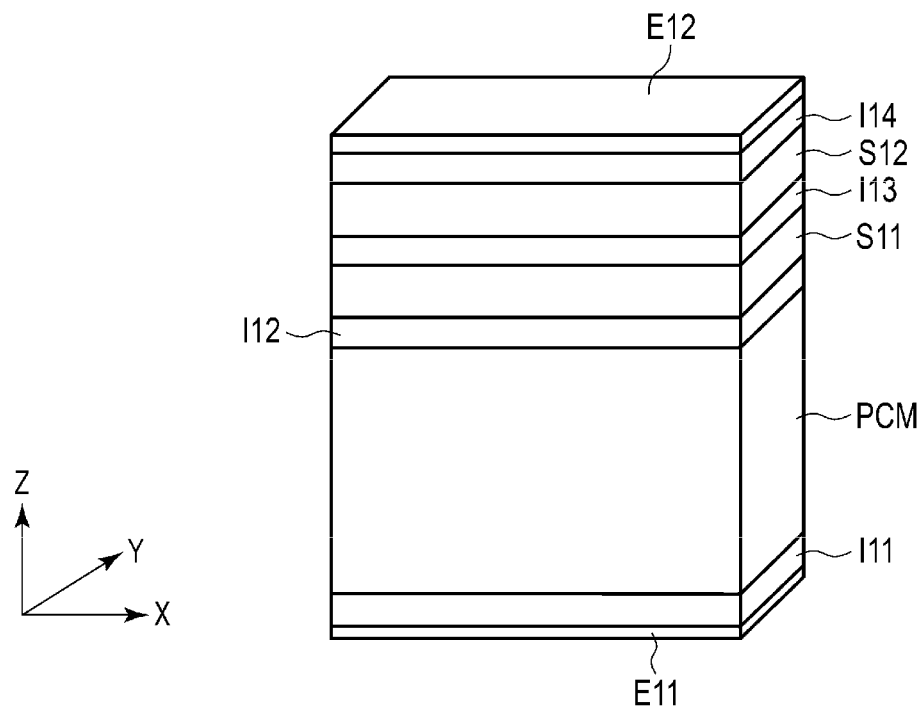
FIG. 17 is a perspective view illustrating a structure of a memory cell.

A memory cell of a semiconductor memory device according to the second embodiment will be described with reference to FIG. 17. FIG. 17 is a perspective view illustrating a structure of the memory cell in the second embodiment.

As illustrated in FIG. 17, the memory cell MC includes a lower electrode E11, an intermediate layer I11 provided on the lower electrode E11, a PCM provided on of the intermediate layer I11, an intermediate layer I12 provided on the PCM, a selector S11 provided on the intermediate layer I12, an intermediate layer I13 provided the selector S11, a selector S12 provided on the intermediate layer I13, an intermediate layer I14 provided on the selector S12, and an upper electrode E12 provided on the intermediate layer I14. As illustrated in FIG. 17, the two selectors S11 and S12 are provided above the PCM in the layer stacking direction (Z) from the lower electrode E11.

In the second embodiment, the memory cell includes two selectors to limit a current flowing in the memory cell. Characteristics of the two selectors are preferably different. When the IV characteristics of the two selectors are changed, the planar area (XY plane) of the stacked layers may be changed, a material may be changed, or a thickness in the Z direction may be changed.

The material of the intermediate layer may be, for example, a metal material. The intermediate layer may be omitted in some examples.

<2-1-2> Characteristics of Memory Cell

Figure 18:
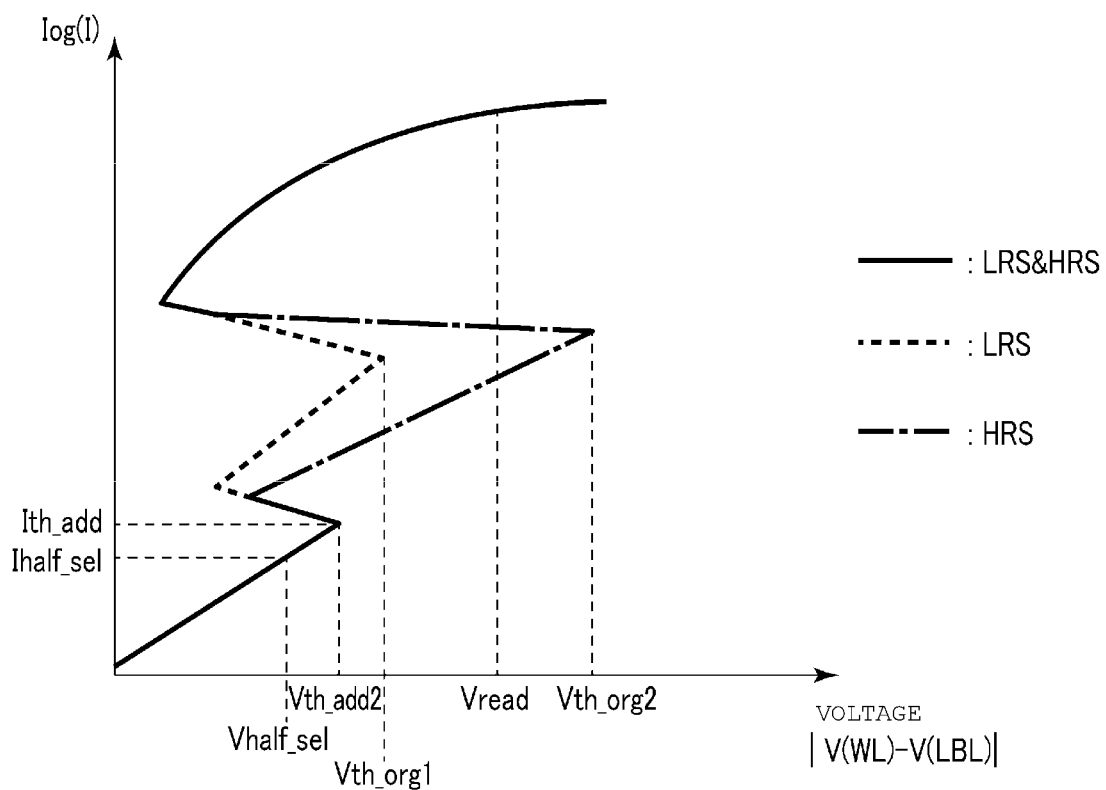
FIG. 18 is a graph illustrating aspects of current-voltage (IV) characteristics of a memory cell.

Next, current-voltage (IV) characteristics of the memory cell of the semiconductor memory device according to the second embodiment will be described with reference to FIG. 18. FIG. 18 is a graph illustrating IV characteristics of the memory cell. The horizontal axis represents a voltage applied across the memory cell MC and the vertical axis represents a cell current flowing in the memory cell MC. The vertical axis is at a log scale. The basic operation in the LRS state or the HRS state is the same as that described in the first embodiment.

As illustrated in FIG. 18, in the second embodiment, characteristics until the voltage Vth_add2 are the same as that of the first embodiment in the LRS state or the HRS state. In the second embodiment, a cell current flowing until the voltage Vth_add2 is reached is less than that of the first embodiment.

In the second embodiment, the voltage Vth_add2 is greater than the one half-selected voltage Vhalf_sel applied to a half-selected cell at the time of a write or read operation.

As described above, by providing two selectors in the memory cell, it is possible to obtain the above-described IV characteristics. For example, the first selector S11 is a selector having characteristics to obtain the relationship threshold voltage Vth_add2>the half-selected voltage Vhalf_sel. In addition, for example, the second selector S12 is a selector having characteristics to obtain the relationship threshold voltage Vth_org1<the threshold voltage Vth_org2.

As a result, it is possible to obtain a voltage relation of the half-selected voltage Vhalf_sel<the threshold voltage Vth_add2<the threshold voltage Vth_org1<the read voltage Vread<the threshold voltage Vth_org2 in the IV characteristics of the memory cell of the semiconductor memory device according to the second embodiment.

<2-2> Advantages

According to the second embodiment, the selectors are provided so that no large current flows even when the voltage Vhalf sel is applied to the half-selected memory cell.

Hereinafter, a comparison example will be described to describe in contrast to the second embodiment.

Figure 19:
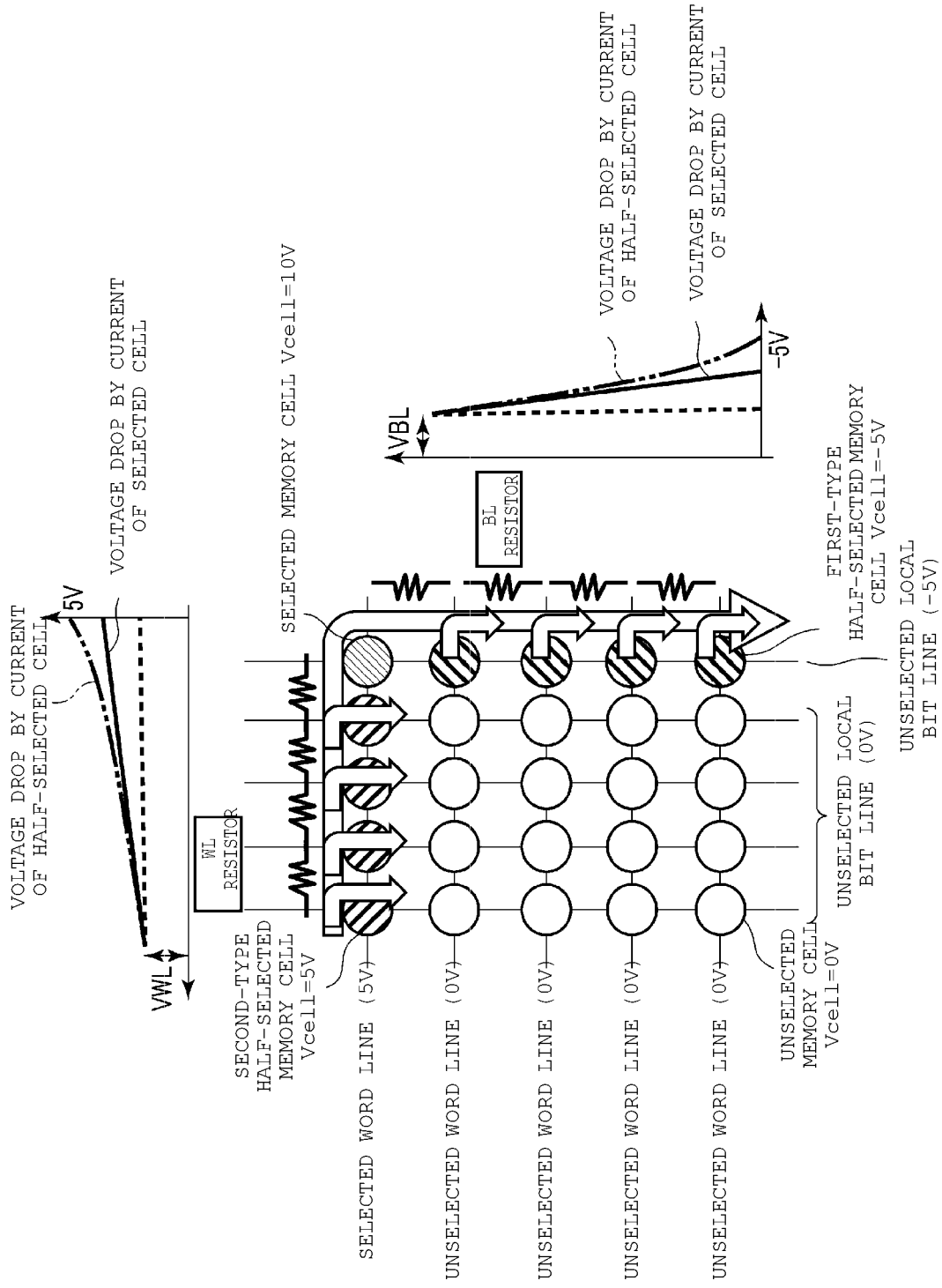
FIG. 19 is a diagram illustrating a relation between a memory cell and a voltage to be applied to each memory cell.
Figure 20:
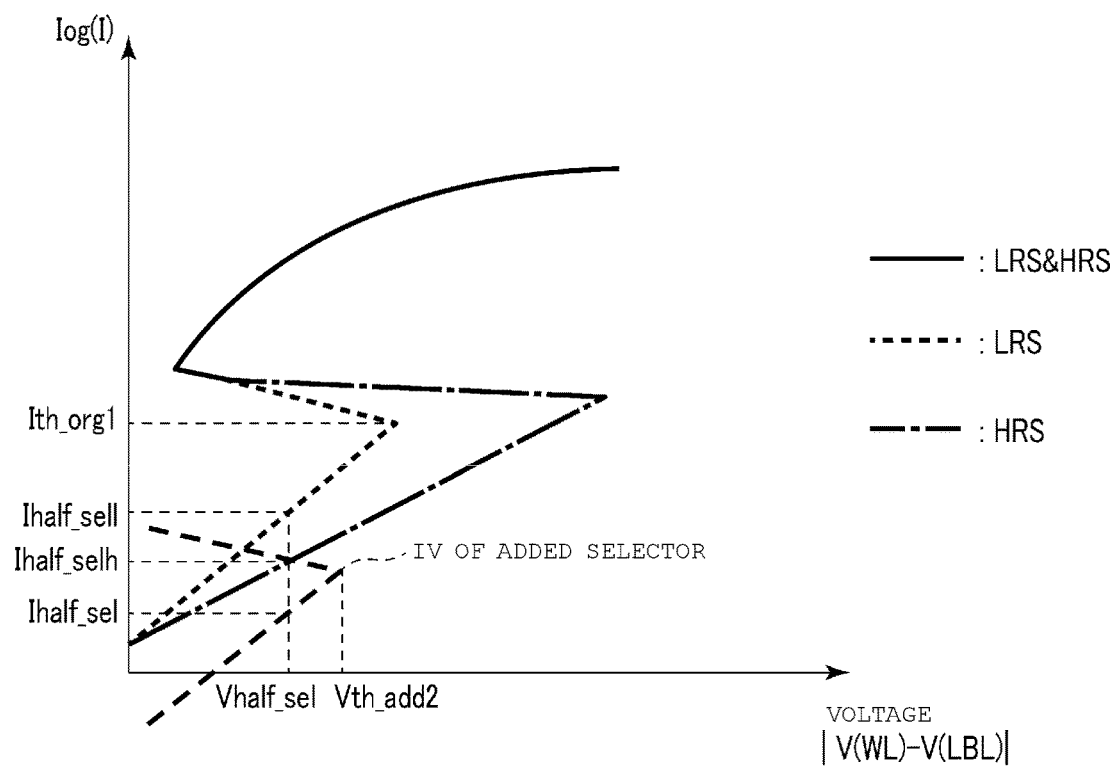
FIG. 20 is a graph illustrating current-voltage (IV) characteristics of a memory cell.

Here, a relation between the memory cell and a voltage to be applied to each memory cell will be described with reference to FIGS. 19 and 20. FIG. 19 is a diagram illustrating a relation between the memory cell and the voltage to be applied to each memory cell. In FIG. 19, to facilitate understanding, voltages to be applied to each word line WL and each local bit line LBL are illustrated specifically. In FIG. 19, for example, it is assumed that 5 V is applied to the selected word line WL, 0 V is applied to the unselected word line WL, −5 V is applied to the selected local bit line LBL, and 0 V is applied to the unselected local bit line LBL. FIG. 20 is a graph illustrating IV characteristics of the memory cell of the semiconductor memory device according to the comparative example.

As illustrated in FIG. 19, a voltage Vcell=V(WL)−V (LBL) is applied to each memory cell. Specifically, 10 V is applied to the selected memory cell, −5 V is applied to the first-type half-selected memory cell, 5 V is applied to the second-type half-selected memory cell, and 0 V is applied to the unselected memory cell.

As illustrated in FIG. 19, when the number of first-type half-selected memory cells increases, a voltage drop by the cell current flowing in the first-type half-selected memory cell is larger. Similarly, when the number of second-type half-selected memory cells increases, a voltage drop by the cell current flowing in the second-type half-selected memory cell is larger. As a result, there is a concern of an intended voltage not being applied to the selected memory cell.

The memory cell of the semiconductor memory device according to the comparative example includes only one selector. In such a case, IV characteristics of the memory cell will be the characteristics illustrated in FIG. 20.

As illustrated in FIG. 20, when the memory cell is in a low resistance state and the voltage Vhalf_sel is applied to the memory cell, a current value is Ihalf_selh (the case of HRS) or Ihalf_sell (the case of LRS), where Ihalf_selh<Ihalf_sell.

As illustrated by the label "IV of an added selector" of FIG. 20, when another selector is provided so that a current Ihalf_sell lower than the current Ihalf_selh (where Ihalf_sel<Ihalf_selh) is set even when the voltage Vhalf_sel is applied to the memory cell in the low resistance state.

As described above, when the current flowing in the half-selected memory cell(s) increases, a desired voltage may not be applied to the selected memory cell.

However, in the second embodiment, since current flowing through the half-selected memory cell can be prevented, the desired voltage can be applied to the selected memory cell.

This is effect holds in a read operation or a write operation.

<3> Third Embodiment

A third embodiment will be described. In the third embodiment, another method of stacking selectors in a memory cell is described. The basic configuration and the basic operation of a device according to the third embodiment are the same as those of the device according to the first and second embodiments.

<3-1> Configuration

<3-1-1> First Example of Memory Cell

Next, a first example of the memory cell of the semiconductor memory device according to the third embodiment will be described with reference to FIG. 21.

Figure 21:
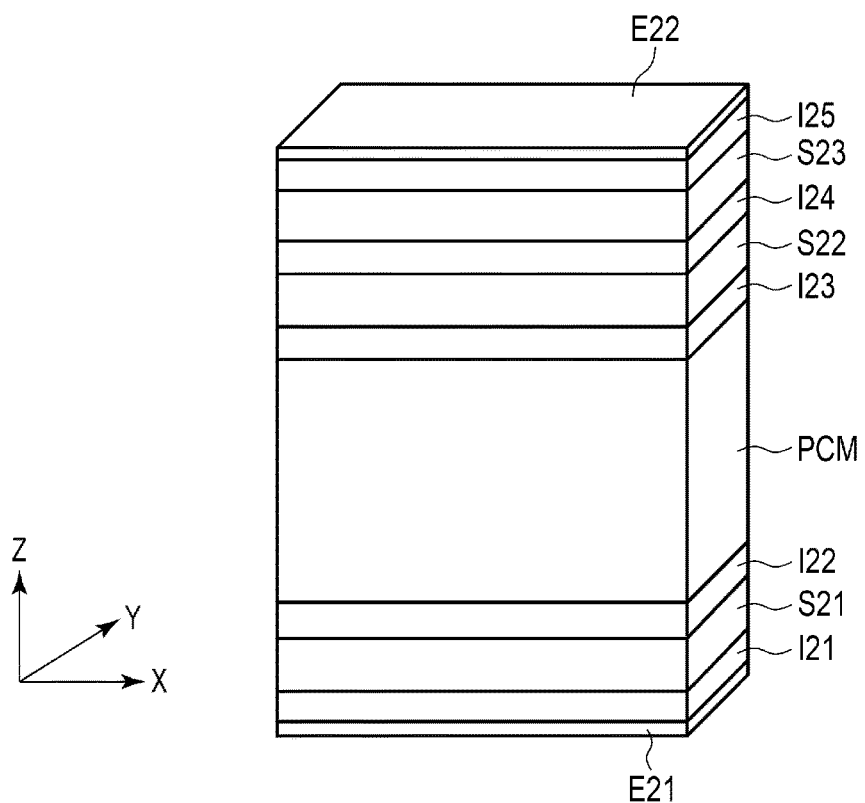
FIG. 21 is a perspective view illustrating a structure of a memory cell.

As illustrated in FIG. 21, the memory cell MC in the third embodiment includes a lower electrode E21, an intermediate layer I21 provided on the lower electrode E21, a selector S21 provided on the intermediate layer I21, an intermediate layer I22 provided on the selector S21, a PCM provided on the intermediate layer I22, an intermediate layer I23 provided on the PCM, a selector S22 provided on the intermediate layer I23, an intermediate layer I24 provided on the selector S22, a selector S23 provided on the intermediate layer I24, an intermediate layer I25 provided on the selector S23, and an upper electrode E22 provided on the intermediate layer I25. As illustrated in FIG. 21, the PCM is interposed between the selectors S21 and S22 and the selector S23 is provided above the selector S22.

<3-1-2> Second Example of Memory Cell

Figure 22:
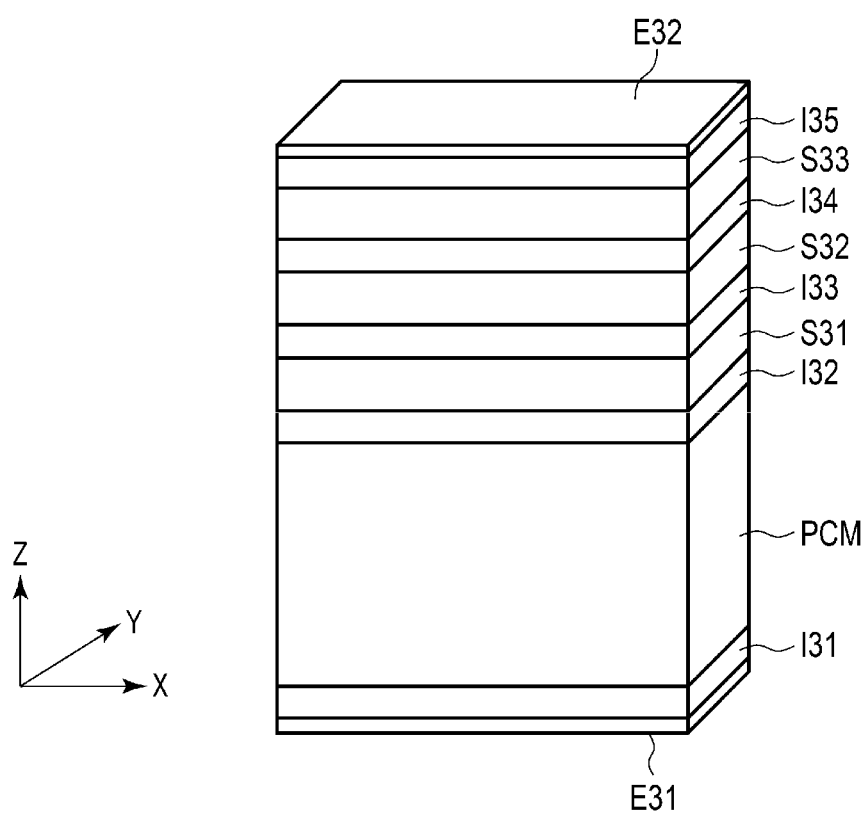
FIG. 22 is a perspective view illustrating a structure of a memory cell.

Next, a second example of the memory cell of the semiconductor memory device according to the third embodiment will be described with reference to FIG. 22. FIG. 22 is a perspective view illustrating the second example of the memory cell.

As illustrated in FIG. 22, the memory cell MC includes a lower electrode E31, an intermediate layer I31 provided on the XY plane of the lower electrode E31, a PCM provided on the XY plane of the intermediate layer I31, an intermediate layer I32 provided on the XY plane of the PCM, a selector S31 provided on the XY plane of the intermediate layer I32, an intermediate layer I33 provided on the XY plane of the selector S31, a selector S32 provided on the XY plane of the intermediate layer I33, an intermediate layer I34 provided on the XY plane of the selector S32, a selector S33 provided on the XY plane of the intermediate layer I34, an intermediate layer I35 provided on the XY plane of the selector S33, and an upper electrode E32 provided on the XY plane of the intermediate layer I35. As illustrated in FIG. 22, the three selectors S31 to S33 are provided above the PCM.

In the embodiment, as will be described below, the memory cell includes three selectors to limit a current flowing in the memory cell. Characteristics of the three selectors are preferably different. When the IV characteristics of the three selectors are changed, the area of the XY plane may be changed, a material may be changed, or a height in the Z direction may be changed.

The material of the intermediate layer may be, for example, a metal material. The intermediate layer may be omitted.

<3-1-3> Characteristics of Memory Cell

Next, current-voltage (IV) characteristics of the memory cell of the semiconductor memory device according to the third embodiment will be described. Since the basic characteristics are the same as those described in the first and second embodiments, the detailed description will be omitted.

Incidentally, in the above-described first embodiment, the IV characteristics of the memory cell of the semiconductor memory device have a voltage relation of the threshold voltage Vth_org1<the read voltage Vread<the threshold voltage Vth_add1<the threshold voltage Vth_org2.

In the above-described second embodiment, the IV characteristics of the memory cell of the semiconductor memory device have a voltage relation of the half-selected voltage Vhalf_sel<the threshold voltage Vth_add2<the threshold voltage Vth_org1<the read voltage Vread<the threshold voltage Vth_org2.

In the memory cell of the semiconductor memory device according to the third embodiment, by providing three selectors, it is possible to combine IV characteristics of the first and second embodiments. For example, the first selectors S21 and S31 are selectors that obtain the characteristics of the threshold voltage Vth_add1>the voltage Vread. The second selectors S22 and S32 are selectors that obtain the characteristics of the threshold voltage Vth_add2>the half-selected voltage Vhalf_sel. For example, the third selectors S23 and S33 are selectors that obtain the characteristics of the threshold voltage Vth_org1<the threshold voltage Vth_org2.

As a result, in the IV characteristics of the memory cell of the semiconductor memory device according to the third embodiment, it is possible to obtain a voltage relation of the half-selected voltage Vhalf_sel<the threshold voltage Vth_add2<the threshold voltage Vth_org1<the read voltage Vread<the threshold voltage Vth_add1<the threshold voltage Vth_org2.

<3-2> Advantages

According to the third embodiment, the three selectors that have different characteristics are provided in the memory cell. Therefore, it is possible to obtain the same advantages as those of the first and second embodiments.

<4> Modification Examples

Each of the above-described embodiments has shown an example in which a negative voltage is applied to the local bit line and a positive voltage is applied to the word line at the time of the write operation or the read operation. However, the present disclosure is not limited thereto, and a positive voltage may be applied to the local bit line and a negative voltage maybe applied to the word line at the time of a write operation or a read operation.

In each of the above-described embodiments, the example in which the sense amplifier is connected to the global bit line has been described. However, the present disclosure is not limited thereto, and the sense amplifier may be connected to a main word line.

The structure of the memory cell in each of the above-described embodiments is exemplary, and the stacking order or the shape of the selector layers and the PCM is not limited to the above-described order or shape.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device, comprising:
   a memory cell having a variable resistance unit, a first selector, and a second selector, the first and second selectors being connected in series with the variable resistance unit and having different switch characteristics from one another;
   a control unit that writes data to the memory cell by setting a resistance state of the variable resistance unit and reads data from the memory cell according to the resistance state of the variable resistance unit; and
   a third selector that has different switch characteristics from the first selector and is connected in series with the first selector, the second selector, and the variable resistance unit.

2. The semiconductor memory device according to claim 1, wherein the variable resistance unit is between the first selector and the second selector.

3. The semiconductor memory device according to claim 1, wherein the first selector and the second selector have different threshold voltages.

4. The semiconductor memory device according to claim 1, wherein the first selector and the second selector have mutually different threshold currents.

5. The semiconductor memory device according to claim 1, wherein the first, second, and third selectors are on the same side of the variable resistance unit.

6. The semiconductor memory device according to claim 1, wherein the variable resistance unit is between the second and third selectors.

7. The semiconductor memory device according to claim 1, wherein the variable resistance unit is a phase change material.

8. The semiconductor memory device according to claim 1, wherein the first and second selectors each comprise a chalcogen element.

9. The semiconductor memory device according to claim 1, wherein at least one of the first and second selectors comprises arsenic doped silicon dioxide or a volatile conductive-bridging random access memory.

10. The semiconductor memory device according to claim 1, wherein the resistance state of the variable resistance unit is set by controlling heating and cooling of the variable resistance unit.

11. The semiconductor memory device according to claim 10, wherein the resistance state of the variable resistance unit changes according to a crystallinity of the variable resistance unit.

12. A semiconductor memory device, comprising:
a memory cell having a variable resistance unit, a first selector, and a second selector, the first and second selectors being connected in series with the variable resistance unit and having different switch characteristics from one another; and
a control unit that writes data to the memory cell by setting a resistance state of the variable resistance unit and reads data from the memory cell according to the resistance state of the variable resistance unit, wherein the first selector is between the second selector and the variable resistance unit.

13. The semiconductor memory device according claim 12, further comprising:
a third selector that has different switch characteristics from the first selector and is connected in series with the first selector, the second selector, and the variable resistance unit.

14. A semiconductor memory device, comprising:
a plurality of memory cells in rows and columns, each memory cell comprising a first selector layer, a second selector layer, and a phase change material in a layer stack, the first and second selectors having different switch characteristics from each other;
a plurality of word lines each respectively connected to a row of memory cells in the plurality of memory cells; and
a plurality of bit lines each respectively connected to a column of memory cells in the plurality of memory cells, wherein
each memory cell is connected between one word line in the plurality of word lines and one bit line in the plurality of bit lines, and
the first and second selector layers are on a same side of the phase change material in the layer stack.

15. The semiconductor memory device according to claim 14, further comprising:
a control unit that writes data to the plurality of memory cells by applying voltages to the plurality of word lines and the plurality of bit lines to set a resistance state of the phase change material in a selected memory cell to one of a high resistance state or a low resistance state.

16. The semiconductor memory device according to claim 14, wherein the phase change material is between the first selector layer and the second selector layer in the layer stack.

17. The semiconductor memory device according to claim 14, wherein the first selector layer has a composition that is different from the second selector layer.

18. A semiconductor memory device, comprising:
a plurality of memory cells in rows and columns, each memory cell comprising a first selector layer, a second selector layer, and a phase change material in a layer stack, the first and second selectors having different switch characteristics from each other;
a plurality of word lines each respectively connected to a row of memory cells in the plurality of memory cells;
a plurality of bit lines each respectively connected to a column of memory cells in the plurality of memory cells; and
a third selector layer in the layer stack, wherein
each memory cell is connected between one word line in the plurality of word lines and one bit line in the plurality of bit lines.

19. The semiconductor memory device according to claim 18, further comprising:
a control unit that writes data to the plurality of memory cells by applying voltages to the plurality of word lines and the plurality of bit lines to set a resistance state of the phase change material in a selected memory cell to one of a high resistance state or a low resistance state.

20. The semiconductor memory device according to claim 18, wherein the first selector layer has a composition that is different from the second selector layer.

* * * * *